(12) United States Patent
Lee (10) Patent No.: US 6,229,368 B1
(45) Date of Patent: May 8, 2001

(54) INTERNAL CLOCK GENERATING CIRCUITS HAVING DELAY COMPENSATION AND METHODS FOR USING THE SAME

(75) Inventor: Dong-yun Lee, Kyungki-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/426,608

(22) Filed: Oct. 26, 1999

(30) Foreign Application Priority Data

Dec. 18, 1998 (KR) .................................................. 98-56203

(51) Int. Cl.[7] ...................................................... G06F 1/04
(52) U.S. Cl. ........................ 327/292; 327/295; 327/141; 327/155; 327/161
(58) Field of Search .................................... 327/291, 292, 327/293, 294, 295, 296, 297, 298, 141, 146, 153, 154, 155, 161, 261, 263, 269, 271, 284, 285; 326/93

(56) References Cited

U.S. PATENT DOCUMENTS

| | | | |
|---|---|---|---|
| 4,998,262 | * | 3/1991 | Wiggers ................................ 375/356 |
| 5,118,975 | * | 6/1992 | Hillis et al. ........................... 327/158 |
| 5,361,277 | * | 11/1994 | Grover ................................... 375/356 |
| 5,398,262 | * | 3/1995 | Ahuja ..................................... 375/356 |
| 5,432,823 | * | 7/1995 | Gasbarro et al. ..................... 375/356 |
| 5,528,187 | * | 6/1996 | Sato et al. ............................. 327/292 |
| 5,684,424 | * | 11/1997 | Felix et al. ............................ 327/293 |
| 5,896,055 | * | 4/1999 | Toyonaga et al. .................... 327/295 |
| 6,114,713 | * | 11/2000 | Eto ........................................ 375/375 |

* cited by examiner

Primary Examiner—Kenneth B. Wells
Assistant Examiner—Hai L. Nguyen
(74) Attorney, Agent, or Firm—Myers Bigel Sibley & Sajovec (57) ABSTRACT

An integrated circuit which generates a plurality of local clock signals with substantially no phase difference from an internal clock signal and a stable internal clock generating circuit that generates an internal clock having with reduced sensitivity to variations in a manufacturing process, temperature, supply voltage and noise are provided. The local clock signal generating circuit includes a plurality of phase blenders, each which receives the signals at two points on a clock signal line which transmits the internal clock signals, blends the received signals, and generates a local clock signal having a phase intermediate the phases of the signals at the two points. The internal clock signal generating circuit includes a feedback circuit and a delay lock loop (DLL) circuit. The feedback circuit generates a dummy local clock signal having the substantially the same phase as the local clock signal, delays the dummy local clock signal for the delay time of an internal circuit in which the local clock signal is used, and generates a feedback clock signal. The DLL circuit receives the feedback clock signal and an external clock signal input from the outside of the integrated circuit device, and generates the internal clock signal. Methods are also provided.

16 Claims, 4 Drawing Sheets

INTERNAL CLOCK GENERATING CIRCUITS HAVING DELAY COMPENSATION AND METHODS FOR USING THE SAME

FIELD OF THE INVENTION

The present invention relates to integrated circuit devices, and more particularly to integrated circuit devices that generate internal clock signals.

BACKGROUND OF THE INVENTION

Integrated circuit devices, such as high speed semiconductor memory devices, typically input and output data in-synch with an externally applied clock signal. For example, in a high speed semiconductor memory device, data input and output operations may utilize an internal clock signal synchronized with the phase of the external clock signal. The internal clock signal is typically generated by an internal clock signal generating circuit using a delay locked loop (DLL) circuit.

The internal clock signal is transmitted to various internal circuits using a clock signal to control their operation, such as input and output circuits placed near input and output pads, via a clock line. The transmitted clock signals, referred to as a local clock signals in the vicinity of the internal circuits, drive an associated input and output circuit.

However, in a conventional high speed semiconductor memory device, clock lines typically take the form of a clock net which has a clock tree structure. The tree structure transmits the internal clock signal from an output port of the internal clock signal generating circuit to a plurality of internal circuits such as input/output circuits. A clock tree typically has different loads, i.e., different parasitic resistances and parasitic capacitances depending on its length. Therefore, the delay time generally varies according to the length of the clock tree. Accordingly, a phase difference may be generated between the transmitted local clock signals in the vicinity of the input/output circuits. The data input/output performance of integrated circuit devices, such as a high speed semiconductor memory devices, may be degraded as a result of the phase difference.

In another aspect of internal clock generation, a conventional internal clock signal generating circuit used in devices, such as high speed semiconductor memory devices, typically includes a conventional Delay Lock Loop ("DLL") circuit. The DLL circuit generally includes a delay monitoring circuit which generates a delay time intended to be the same as a delay time produced by the internal circuits carrying the internal clock signal including, for example, a clock signal buffer, a clock signal line, and an input/output circuit. Such a conventional DLL circuit typically generates an internal clock signal using the phase difference between a feedback clock signal output by the delay monitoring circuit and an external clock signal. However, the delay monitoring circuit in such a conventional DLL circuit typically has a complicated design, has a large layout area, and consumes a large amount of power. Also, when temperature, supplied voltage, noise, and/or the manufacturing process are changed, the delay time generated by the delay monitoring circuit may become widely different from the delay time generated by the clock net and the input/output circuits. Therefore, the performance of the high speed semiconductor memory device can be degraded.

SUMMARY OF THE INVENTION

It is, therefore, an object of the present invention to provide a circuit for generating a plurality of local clock signals which may have no phase difference between the local clock signals.

It is a further object of the present invention to provide a clock generating circuit which may perform consistently independently of the manufacturing process, temperature, supplied voltage, noise and other variables which may affect integrated circuit performance.

In order to provide for the foregoing objectives, an integrated circuit device is provided having a local clock signal generating circuit including a phase blender circuit which receives an internal clock signal from at least two displaced points on an internal clock signal line. The internal clock signal from the two points is blended to compensate for delay caused by the characteristics, such as the impedence, of the internal clock signal line to provide a local clock signal to an internal circuit in the vicinity of the local clock signal generating circuit. The local clock generating circuit further includes one or more additional phase blender circuits that receive signals from additional pairs of points and generate additional local clock signals for other internal circuits. In a preferred embodiment, each phase blender circuit receives one input signal from a forward line of the internal clock signal line and a second input from the backward (return) line of the internal clock signal line in the vicinity of each phase blender circuit with each phase blender circuit, in turn, being in the vicinity of the internal circuit receiving the output local clock signals of the respective phase blender circuits.

The internal clock generating aspects of the present invention are provided by a feedback clock generating circuit in the internal clock generating circuit which generates a dummy clock signal from a dummy phase blender circuit and delays the dummy clock signal by a delay circuit configured to introduce a delay corresponding to the delay of the internal circuits receiving the local clock signals. The phase of the internal clock signal and the local clock signals may thereby be matched, preferably regardless of variables, such as temperature, supplied voltage and other variables, which may affect the performance of conventional internal clock generating circuits.

In one embodiment of the present invention, an integrated circuit device is provided including a first phase blender circuit having a first input coupled to a first point on a clock signal line and a second input coupled to a second point on the clock signal line displaced from the first point. A local clock signal output is generated by the first phase blender circuit responsive to the first input and the second input. A second phase blender circuit is also included having a third input coupled to a third point on the clock signal line displaced from the first point and the second point and a fourth input connected to a fourth point on the clock signal line displaced from the first, second, and third point. A second local clock signal output is generated by the second phase blender circuit responsive to the third input and the fourth input. Preferably, the local clock output of the first phase blender circuit and the local clock output of the second phase blender circuit have substantially no phase difference.

In a particular embodiment of the present invention, the clock signal line includes a forward clock signal line connected from an internal clock generating circuit of the integrated circuit device and a backward clock signal line connected from the vicinity of an internal circuit of the integrated circuit device remote from the internal clock generating circuit to the vicinity of the internal clock generating circuit. The first point and the third point are connected to the forward clock signal line and the second point and the fourth point are connected to the backward clock signal line.

In a further embodiment of the present invention, each of the phase blenders includes a first inverter coupled to the first input and a second inverter coupled to the second input. A third inverter having inputs coupled to outputs of the first inverter and the second inverter provides the local clock signal output of the first phase blender.

In a further aspect of the present invention, the integrated circuit device includes an internal clock signal generating circuit that generates an internal clock signal on the clock signal line responsive to an external clock signal. The internal clock signal generating circuit includes a delay line circuit that delays the external clock signal to provide the internal clock signal and a delay monitoring circuit that generates a feedback clock signal responsive to a delay time of the clock signal line. The internal clock generating circuit further includes a phase detector circuit coupled to the feedback clock signal and the external clock signal that determines a phase difference between the feedback clock signal and the external clock signal and a delay control circuit that controls the delay line circuit responsive to the phase detector circuit. In one embodiment, the delay monitoring circuit includes a feedback circuit that generates a dummy local clock signal having a phase which is substantially the same as a phase of the local clock signal output of the first phase blender circuit and the local clock signal output of the second phase blender circuit as the feedback clock signal. The feedback circuit may further include a feedback delay circuit that delays the dummy local clock signal for a time corresponding to a delay time of an internal circuit coupled to at least one of the local clock signal outputs. The feedback circuit may also include a phase blender circuit having a fifth input connected to a fifth point on the clock signal line displaced from the first, second, third and fourth points and a sixth input connected to a sixth point on the clock signal line displaced from the first, second, third, fourth and fifth points that generates the dummy local clock signal.

In a further embodiment of the present invention, the delay monitoring circuit generates a delay time that corresponds to the delay time of the clock signal line as the feedback signal responsive to a delay time of an output signal of the delay line circuit. The delay time generated by the delay monitoring circuit may further correspond to the delay time of the first phase blender circuit and the clock signal line. In a preferred embodiment wherein the internal clock signal output by the delay line circuit is coupled to the internal clock line through a clock line buffer, the delay time generated by the delay monitoring circuit corresponds to the combined delay time of the clock line buffer and the first phase blender circuit and the clock signal line.

In yet another aspect of the present invention, an integrated circuit device is provided including an internal circuit operating responsive to a local clock signal generated from an internal clock signal. A feedback circuit generates a dummy local clock signal having a phase which is substantially the same as a phase of the local clock signal as a feedback clock signal. A delay locked loop circuit generates the internal clock signal responsive to the feedback clock signal and an external clock signal, the delay lock loop circuit and the feedback circuit being at a location displaced from the internal circuit. The feedback circuit may further include a feedback delay circuit that delays the dummy local clock signal for a time corresponding to a delay time of the internal circuit. In one embodiment, the feedback circuit includes a phase blender circuit having a first input connected to a first point on a clock signal line and a second input connected to a second point on the clock signal line displaced from the first point that generates the dummy local clock signal. The clock signal line may include a forward clock signal line connected from the vicinity of the delay locked loop and a backward clock signal line connected from the vicinity of the internal circuit to the vicinity of the internal clock generating circuit in which case the first point is preferably connected to the forward clock signal line and the second point is preferably connected to the backward clock signal line.

In a further aspect of the present invention, methods are provided for generating a local clock signal for a semiconductor memory device including a clock signal line for transmitting an internal clock signal, and a plurality of internal circuits which operate in response to a corresponding local clock signal. Signals are received at two points on the clock signal line in the vicinity of at least one of the plurality of internal circuits. The received signals are blended and the corresponding local clock signal is generated from the blended received signals. The blending step may include inverting one of the received signals and the other of the received signals and blending the two inverted signals. The blended signal is inverted and the inverted blended signal is output as the corresponding local clock signal.

In a final aspect of the present invention, methods are provided for generating an internal clock signal for a semiconductor memory device including a clock signal line for transmitting an internal clock signal, and a plurality of internal circuits which operate in response to a corresponding local clock signal, the internal circuits having an associated delay time. Signals are received at two points on the clock signal line and blended to generate the corresponding local clock signal. A dummy local clock signal is generated having substantially the same phase as the generated corresponding local clock signal. The dummy local clock signal is delayed for the delay time of the internal circuits to generate a feedback clock signal and the internal clock signal is generated using a phase difference between the feedback clock signal and an external clock signal input from the outside of the semiconductor memory device.

The internal clock signal generating step may include comparing a phase of the external clock signal to a phase of the feedback clock signal to detect the phase difference. A delay control signal may then be generated in response to the detected phase difference and a delay time may be determined in response to the delay control signal, the external clock signal may be delayed for the delay time and the delayed external clock signal may be output as the internal clock signal.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
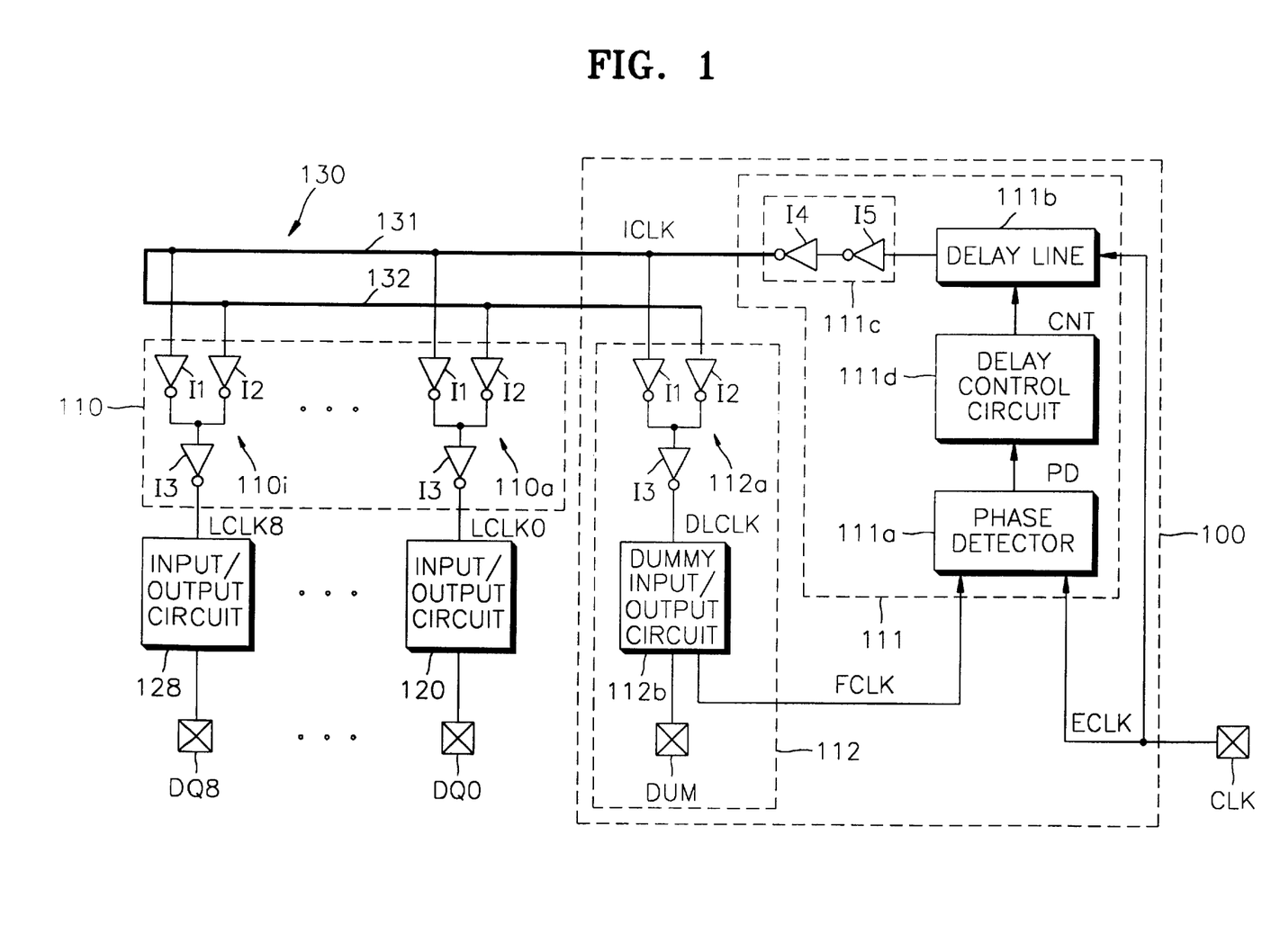
FIG. 1 is an electrical schematic of an integrated circuit device according to a first embodiment of the present invention.

Referring now to FIG. 1, a block electrical schematic is provided illustrating an integrated circuit device, such as a semiconductor memory device, which includes a local clock signal generating circuit 110 according to an embodiment of the present invention and an internal clock signal generating circuit 100 according to an embodiment of the present invention.

In the illustrated embodiment of FIG. 1, the semiconductor memory device includes an internal clock signal generating circuit 100 having a delay locked loop (DLL) circuit 111 and a feed-back circuit 112, a clock signal line 130, a local clock signal generating circuit 110, and internal circuits. As shown in FIG. 1 the internal circuits are a plurality of input/output circuits 120, 128, each having an associated input/output pad DQ0, DQ8. Also shown in FIG. 1 is a clock signal pad CLK that receives an external clock signal from outside the integrated circuit device.

The clock line 130 transmits an internal clock signal ICLK generated by the internal clock signal generating circuit 100, and has a round trip structure including a forward clock signal line 131 connected from the output port of the internal clock signal generating circuit 100 to the vicinity of the farthest input/output circuit 128, and a backward clock line 132 connected from the vicinity of the farthest input/output circuit 128 to the vicinity of the internal clock signal generating circuit 100.

The local clock signal generating circuit 110 generates local clock signals LCLK0, LCLK8 for operating the input/output circuits 120, 128, and includes a plurality of first phase blenders 110a, 110i. The first phase blenders 110a, 110i each receive signals from two displaced points on the clock signal line 130. In the illustrated embodiment, one point is on the forward clock signal line 131 and one point is on the return clock signal line 132. The local clock signal generating circuit 110 blends the received signals and generates local clock signals LCLK0, LCLK8 each having a phase which is intermediate the phases of the two points on the clock signal line 130. Therefore, theoretically, when the delay times of the forward 131 and backward 132 clock lines vary linearly in proportion to the distance from the output port of the internal clock signal generating circuit 100, there is substantially no phase difference between the local clock signals LCLK0, LCLK8.

As shown in the illustrated embodiment of FIG. 1, each of the first phase blenders 110a, 110i includes a first inverter I1 that inverts the signal from a point on the forward clock signal line 131 and a second inverter I2 that inverts the signal from a point on the return clock signal line 132. A third inverter I3 inverts the blended signal output from a connected node of the output ports of the first I1 and second I2 inverters and outputs the inverted signal as the respective local clock signals LCLK0 through LCLK8. It is to be understood that the first phase blenders 110a, 110i can be comprised of other logic gates and the present invention is not limited to the illustrated embodiment.

Each of the input/output circuits 120, 128 may receive data via a corresponding input/output pad among the input/output pads DQ0, DQ8 and/or output data to the corresponding input/output pad responsive to a corresponding local clock signal among the local clock signals LCLK0, LCLK8. The input/output circuits 120, 128 may be connected to a memory cell array via a data path and predetermined internal circuits (not shown in the drawings).

The local clock signals LCLK0 through LCLK8 generated according to the present invention may be used in integrated circuit devices other than the semiconductor memory device illustrated in FIG. 1. Examples of other applications include a shift circuit for shifting a small number of data to a multiplicity of data or a multiplicity of data to a small number of data, for example, in order to input/output data to/from a memory cell, and an interface logic circuit for receiving an external signal to control a selected internal circuit.

The operations of the internal clock signal generating circuit 100 in the illustrated embodiment of FIG. 1 will now be described. The internal clock signal generating circuit 100 includes the DLL circuit 111 and the feedback circuit 112.

The feedback circuit 112 generates a dummy local clock signal DLCLK having substantially the same phase as the phases of the local clock signals LCLK0, LCLK8. The dummy local clock signal DLCLK is delayed for substantially the same time as the delay time of the input/output circuits 120 through 128 to generate a feedback clock signal FCLK. In the embodiment of FIG. 1, the feedback circuit 112 includes a phase blender 112a having essentially the same configuration as the phase blenders 110a,110i. Feedback circuit 112 also includes a dummy input/output circuit 112b having substantially the same delay time as the input/output circuits 120, 128. A dummy pad DUM is also shown in FIG. 1. The phase blender 112a receives signals from two points on the clock line 130 near the internal clock signal generating circuit 100, preferably, one input signal is taken from a point on the forward clock line 131 and a second input signal is taken from a point on the backward clock line 132. The received input signals are blended and the dummy local clock signal DLCLK having a phase between the phases of the signals at the two points on the clock line is generated. The dummy input/output circuit 112b preferably delays the dummy local clock signal DLCLK for the same amount of time as the delay time of the input/output circuits 120, 128, and outputs the feedback clock signal FCLK.

The delay time of the input/output circuits 120, 128 refers to the time difference between when the input/output circuits 120,128 are turned on by the local clock signals LCLK0, LCLK8 and when the voltage of an external data bus connected to the input/output pads DQ0 through DQ8 is changed by output data. Accordingly, even when the manufacturing process, temperature, supply voltage, and noise are changed, the phase difference between the feedback clock signal FCLK and the signals output via the input/output circuits 120, 128 becomes zero in an ideal case.

The DLL circuit 111 as shown in FIG. 1 receives the feedback clock signal FCLK and an external clock signal ECLK input from outside of the semiconductor memory device via the clock pad CLK. The DLL circuit 111 in turn generates the internal clock signal ICLK and outputs the internal clock signal ICLK to the clock line 130. In the embodiment of FIG. 1, the DLL circuit 111 includes a phase detector 111a, a delay line 111b, a clock signal buffer 111c, and a delay control circuit 111d. The phase detector 111a compares the phase of the external clock signal ECLK to the phase of the feedback clock signal FCLK, and detects the phase difference between the two phases. The delay control circuit 111d controls the delay time of the delay line 111b in response to the output (PD) of the phase detector 111a. The delay time of the delay line 111b is determined in response to the output (CNT) of the delay control circuit 111d. The delay line 111b delays the external clock signal ECLK for the delay time. The clock signal buffer 111c is connected between the output port of the delay line 111b and the clock line 130 and buffers the output signal of the delay line 111b to output the internal clock signal ICLK to the clock line 130.

Thus, the internal clock signal generating circuit 100, using feedback circuit 112, may provide improved performance through delay time matching even when subject to variations in the manufacturing process, temperature, supply voltage, and noise. Also, the internal clock signal generating circuit 100 may be simply designed, consume less power, and have a small lay out area.

It is to be understood that the benefits of operations according to the present invention may be obtained for both output and input operation of the input/output circuits 120, 128.

Figure 2:
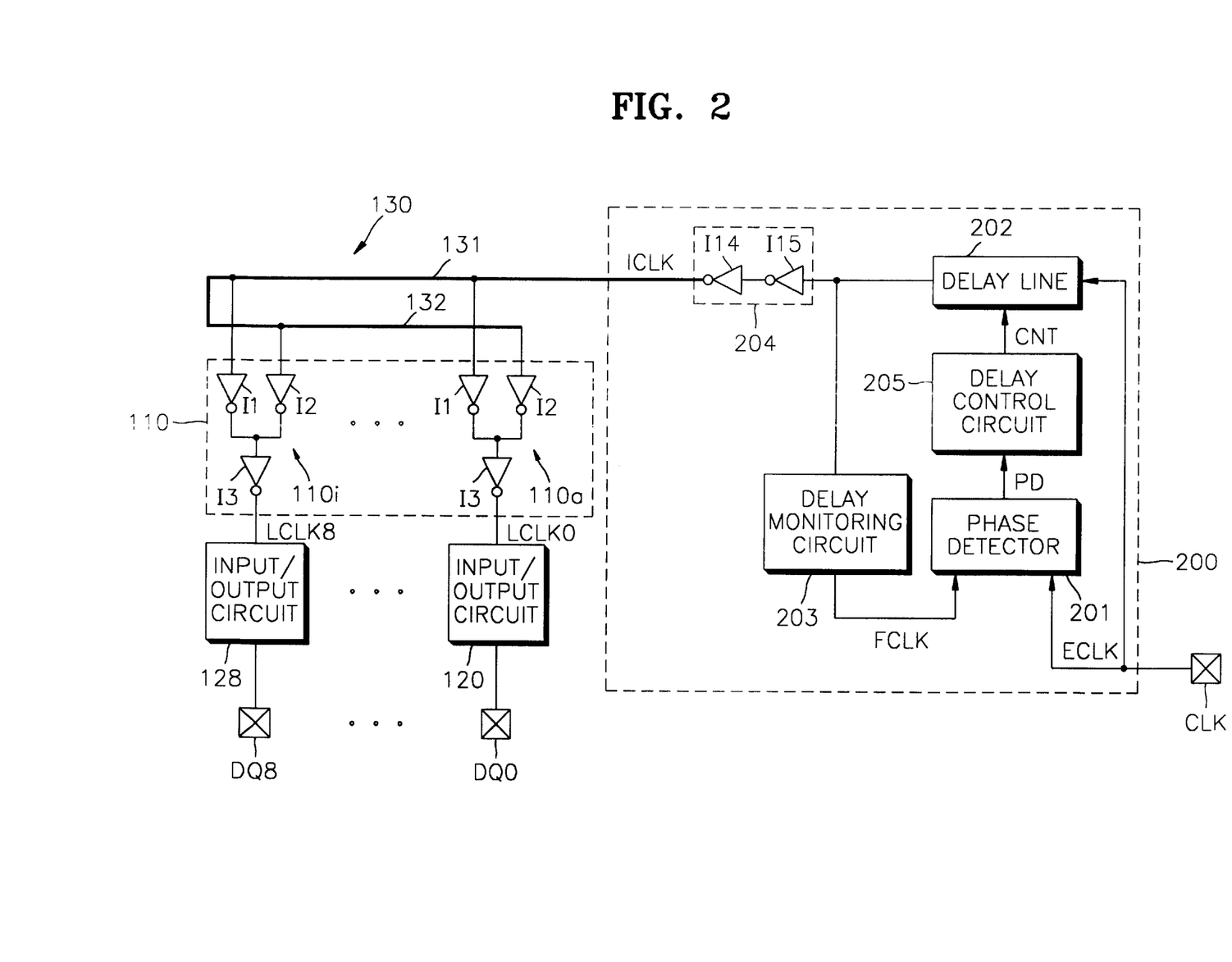
FIG. 2 is an electrical schematic of an integrated circuit device according to a second embodiment of the present invention.

Referring now to FIG. 2, an electrical schematic is provided which illustrates a semiconductor memory device according to a second embodiment of the present invention. The semiconductor memory device includes an internal clock signal generating circuit 200, a clock line 130, a local clock signal generating circuit 110, and internal circuits. The internal circuits are shown as a plurality of input/output circuits 120, 128, having a plurality of input/output pads DQ0 through DQ8. Also shown is a clock pad CLK.

The clock line 130, the local clock signal generating circuit 110, the input/output circuits 120, 128, the input/output pads DQ0 through DQ8, and the clock pad CLK operate in the same manner as described with reference to FIG. 1, and, hence, will not be further described. The local clock signals LCLK0 through LCLK8 generated from the local clock signal generating circuit 110 can be used in other internal circuits, in a similar way to the embodiment of FIG. 1. The other internal circuits may be, for example, a shift circuit for shifting a small number of data to a multiplicity of data or shifting a multiplicity of data to a small number of data in order to input/output data to/from a memory cell or an interface logic circuit for receiving an external signal and controlling selected internal circuits.

The internal clock signal generating circuit 200 illustrated in FIG. 2 includes a phase detector 201, a delay line 202, a delay monitoring circuit 203, a clock signal buffer 204, and a delay control circuit 205. The phase detector 201 compares the phase of the external clock signal ECLK to the phase of the output signal FCLK of the delay monitoring circuit 203, which is a feedback clock signal, and detects the phase difference between the two signals. The delay control circuit 205 controls the delay time of the delay line 202 in response to the output (PD) of the phase detector 201. The delay time of the delay line 202 is determined in response to the output (CNT) of the delay control circuit 205, and the delay line 202 delays the external clock signal ECLK for the delay time.

The delay monitoring circuit 203 monitors the delay time of the output signal of the delay line 202 and generates the feedback clock signal FCLK. In other words, the delay monitoring circuit 203 generates a delay time that is substantially the same as the delay time generated by the clock signal buffer 204, the clock line 130, the local clock signal generating circuit 110, and the input/output circuits 120, 128, delays the output signal of the delay line 202 for the second delay time, and outputs the delayed signal as the feedback clock signal FCLK.

The clock signal buffer 204 is connected between the output port of the delay line 202 and the clock line 130. The clock signal buffer 204 buffers the output signal of the delay line 202 to output the internal clock signal ICLK to the clock line 130.

As with the embodiment of FIG. 1, in the semiconductor memory device according to the embodiment of the present invention of FIG. 2, there is preferably no phase difference between the local clock signals LCLK0, LCLK8 in the ideal case where the delay times of the forward 131 and backward 132 clock lines linearly increase or decrease in proportion to the distance from the output port of the internal clock signal generating circuit 200.

Figure 3:
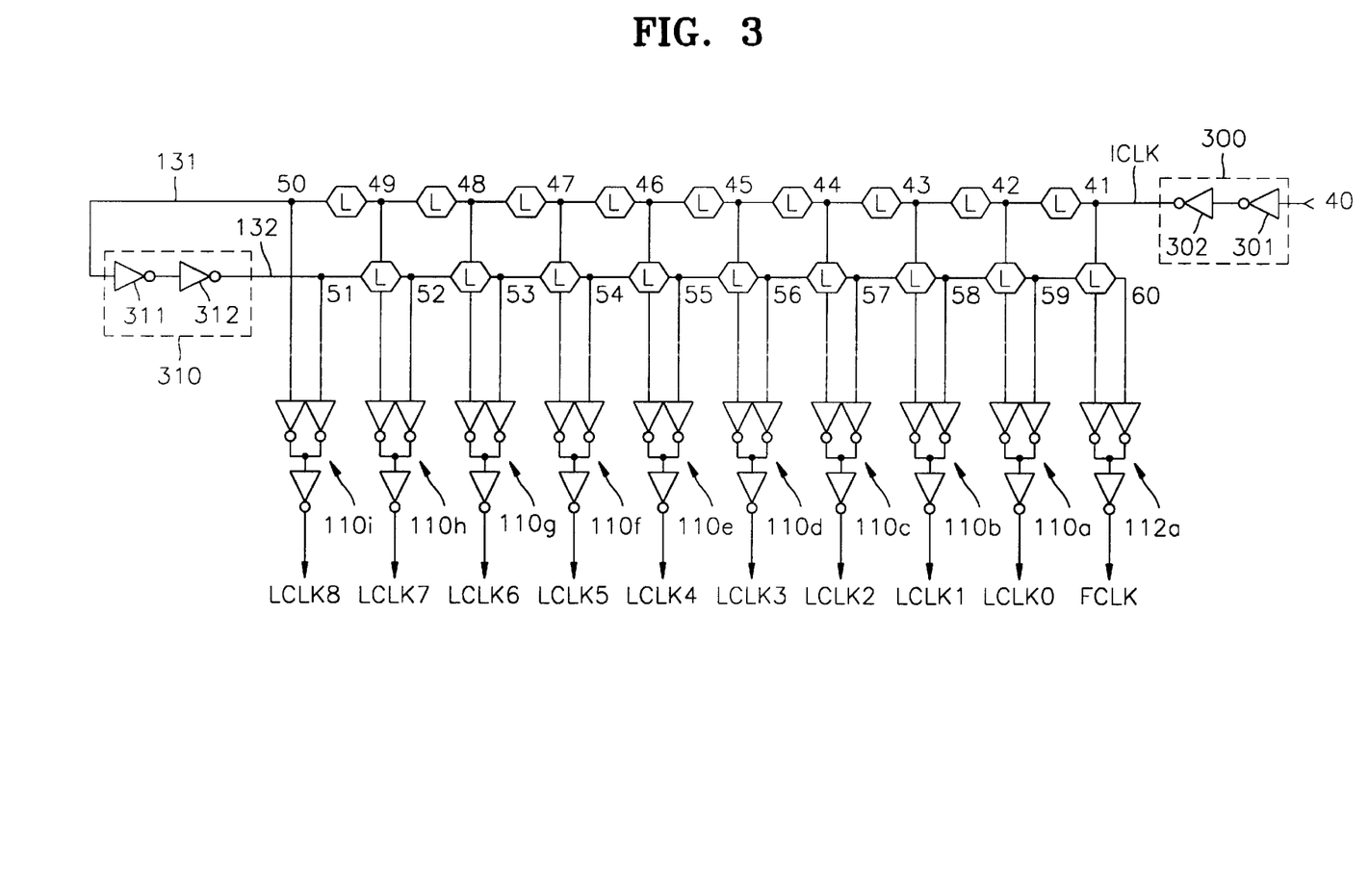
FIG. 3 is an electrical schematic illustrating the clock signal line connections of the integrated circuit device of FIGS. 1 and 2.

FIG. 3 is an electrical schematic illustrating the characteristics of the clock signal line 130 shown in FIG. 1. The clock signal buffer 300 corresponds to the clock signal buffer 111c of FIG. 1 and 204 of FIG. 2. The forward clock line 131 shown in FIG. 1, the backward clock line 132 shown in FIG. 1 are also shown in FIG. 3. The first phase blenders 110a through 110i as illustrated in FIG. 3 show a plurality of eight phase blenders corresponding to the first phase blenders 110a, 110i shown in FIG. 1. The second phase blender 112a corresponds to the like numbered device shown in FIG. 1.

As described above in connection with FIGS. 1 and 2, the delay time generated by a load (L), such as a parasitic resistance and a parasitic capacitance, of the forward 131 and backward 132 clock lines, in an ideal case, linearly increases or decreases in proportion to their respective physical distance from the output port of the clock signal buffer 300. In practice, when the clock signal buffer 300 has a small driving capacity and the forward 131 and backward 132 clock lines each have a load (L), the delay time may not linearly increase or decrease. Accordingly, a second clock signal buffer 310 is shown in FIG. 3 interposed at a contact position between the forward 131 and backward 132 clock lines.

Figure 4:
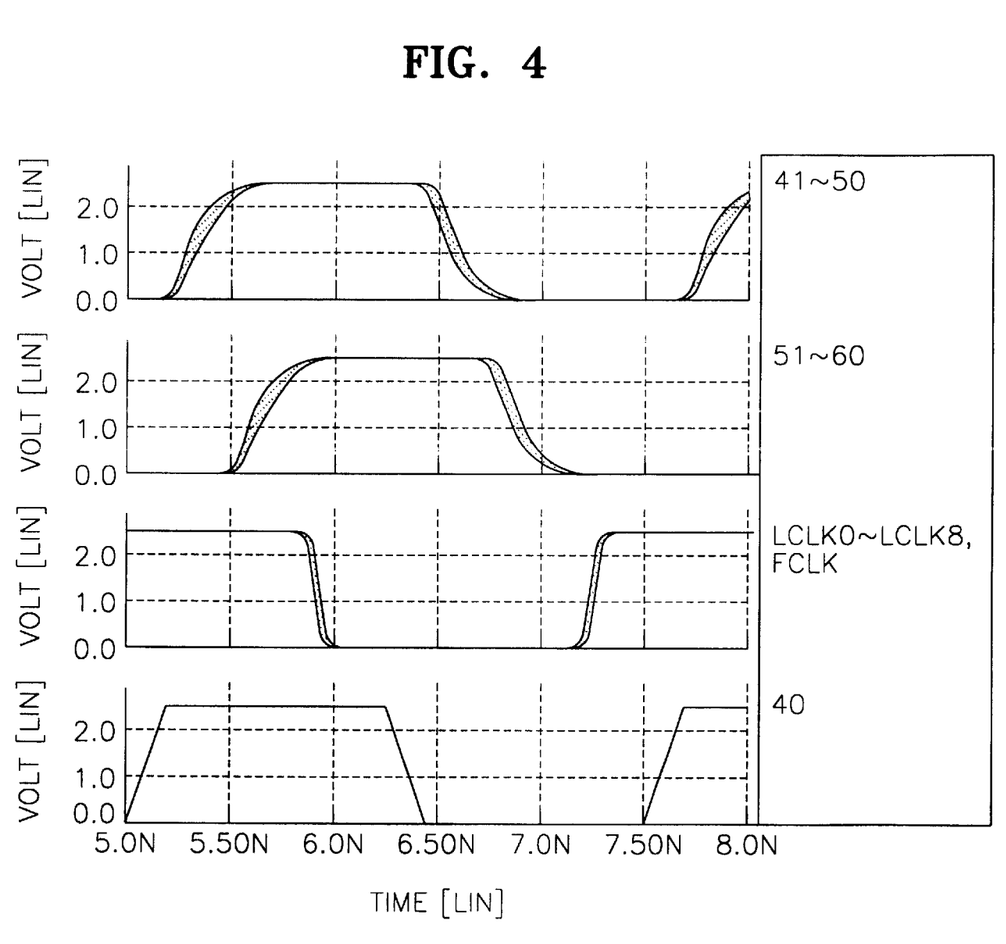
FIG. 4 is a waveform graph which illustrates operation of the device of FIG. 3.

FIG. 4 is a waveform graph showing the results of a simulation performed on the circuit shown in FIG. 3. In FIG. 3, reference numeral 40 denotes the input signal of the clock signal buffer 300 shown in FIG. 3. Reference numerals 41 through 50 denote the signals at the points 41 through 50 of the forward clock line 131 shown in FIG. 3. Reference numerals 51 through 60 denote the signals at the points 51 through 60 of the backward clock line 132 shown in FIG. 3. Reference character FCLK denotes the output signal (feedback clock signal) of the phase blender 112a shown in FIG. 3. Reference characters LCLK0 through LCLK8 denote the output signals (local clock signals) of the phase blenders 110a through 110i shown in FIG. 3.

As shown in FIG. 4, a predetermined phase difference exists between signals from the points 41 through 50 on the forward clock line 131, and a predetermined phase difference also exists between the signals at the points 51 through 60 on the backward clock line 132. However, it can also be seen that there is little phase difference between the feedback clock signal FCLK and each of the local clock signals LCLK0 through LCLK8.

As described above, according to the local clock signal generating circuit and method according to the present invention, a plurality of local clock signals with reduced phase difference can be generated from an internal clock signal. Accordingly, in a semiconductor memory device including a local clock signal generating circuit according to the present invention, a plurality of local clock signals with no phase difference are provided to internal circuits, such as input/output circuits, a shift circuit, an interface logic circuit, etc., so that the integrated circuit device may operate in a stable manner and have an improved input/output performance. Also, utilizing an internal clock generating circuit and method according to the present invention, there may be little phase difference between a feedback clock signal used in a phase detector and each of the signals output via internal circuits, such as the input/output circuits, even when the manufacturing process, temperature, supply voltage, and noise levels vary. Thus, a stable internal clock signal having substantially the same phase as an external clock signal may be generated. Furthermore, the internal clock signal generating circuit may be simply designed, consume less power, and have a small layout area.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a first phase blender circuit having a first input coupled to a first point on a clock signal line and a second input coupled to a second point on the clock signal line displaced from the first point and a local clock signal output generated by the first phase blender circuit responsive to the first input and the second input;
   a second phase blender circuit having a third input coupled to a third point on the clock signal line displaced from the first point and the second point and a fourth input connected to a fourth point on the clock signal line displaced from the first, second, and third point and a local clock signal output generated by the second phase blender circuit responsive to the third input and the fourth input;
   wherein the clock signal line includes a forward clock signal line connected from a vicinity of an internal clock generating circuit of the integrated circuit device and a backward clock signal line connected from a vicinity of an internal circuit of the integrated circuit device to the vicinity of the internal clock generating circuit and wherein the first point and the third point are connected to the forward clock signal line and the second point and the fourth point are connected to the backward clock signal line; and
   wherein the first phase blender circuit comprises:
   a first inverter coupled to the first input;
   a second inverter coupled to the second input; and
   a third inverter having inputs coupled to outputs of the first inverter and the second inverter and outputting the local clock signal output of the first phase blender.

2. An integrated circuit device according to claim 1 wherein the local clock output of the first phase blender circuit and the local clock output of the second phase blender circuit have substantially no phase difference.

3. An integrated circuit device comprising:
   a first phase blender circuit having a first input coupled to a first point on a clock signal line and a second input coupled to a second point on the clock signal line displaced from the first point and a local clock signal output generated by the first phase blender circuit responsive to the first input and the second input;
   a second phase blender circuit having a third input coupled to a third point on the clock signal line displaced from the first point and the second point and a fourth input connected to a fourth point on the clock signal line displaced from the first, second, and third point and a local clock signal output generated by the second phase blender circuit responsive to the third input and the fourth input; and
   an internal clock signal generating circuit that generates an internal clock signal on the clock signal line responsive to an external clock signal, the internal clock signal generating circuit comprising:
   a delay line circuit that delays the external clock signal to provide the internal clock signal;
   a delay monitoring circuit that generates a feedback clock signal responsive to a delay time of the clock signal line;
   a phase detector circuit coupled to the feedback clock signal and the external clock signal that determines a phase difference between the feedback clock signal and the external clock signal; and
   a delay control circuit that controls the delay line circuit responsive to the phase detector circuit.

4. An integrated circuit device according to claim 3 wherein the delay monitoring circuit comprises:
   a feedback circuit that generates a dummy local clock signal having a phase which is substantially the same as a phase of the local clock signal output of the first phase blender circuit and the local clock signal output of the second phase blender circuit as the feedback clock signal.

5. An integrated circuit device according to claim 4 wherein the feedback circuit further comprises a feedback delay circuit that delays the dummy local clock signal for a time corresponding to a delay time of an internal circuit coupled to at least one of the local clock signal outputs.

6. An integrated circuit device according to claim 5 wherein the feedback circuit comprises:
   a third phase blender circuit having a fifth input connected to a fifth point on the clock signal line displaced from the first, second, third and fourth points and a sixth input connected to a sixth point on the clock signal line displaced from the first, second, third, fourth and fifth points that generates the dummy local clock signal.

7. An integrated circuit device according to claim 3 wherein the delay monitoring circuit delays an output signal of the delay line circuit for a predetermined time to generate the feedback clock signal.

8. An integrated circuit device according to claim 7 wherein the predetermined time generated by the delay monitoring circuit corresponds to a delay time of the first phase blender circuit and the delay time of the clock signal line.

9. An integrated circuit device according to claim 7 wherein the internal clock signal output by the delay line circuit is coupled to the internal clock line through a clock line buffer and the predetermined time generated by the delay monitoring circuit corresponds to the delay time of the clock line buffer and the first phase blender circuit and the clock signal line.

10. An integrated circuit device according to claim 3 wherein the local clock output of the first phase blender circuit and the local clock output of the second phase blender circuit have substantially no phase difference.

11. An integrated circuit device comprising:
    an internal circuit operating responsive to a local clock signal generated from an internal clock signal;
    a feedback circuit that generates a dummy local clock signal having a phase which is substantially the same as a phase of the local clock signal;

a feedback delay circuit that delays the dummy local clock signal for a time corresponding to a delay time of the internal circuit to provide a feedback clock signal;

a delay locked loop circuit that generates the internal clock signal responsive to the feedback clock signal and an external clock signal, the delay lock loop circuit and the feedback circuit being at a location displaced from the internal circuit; and wherein the feedback circuit comprises a phase blender circuit having a first input connected to a first point on a clock signal line and a second input connected to a second point on the clock signal line displaced from the first point that generates the dummy local clock signal.

12. An integrated circuit device according to claim 11 wherein the clock signal line includes a forward clock signal line connected from the vicinity of the delay locked loop and a backward clock signal line connected from the vicinity of the internal circuit to the vicinity of the internal clock generating circuit and wherein the first point is connected to the forward clock signal line and the second point is connected to the backward clock signal line.

13. A local clock signal generating method for a semiconductor memory device including a clock signal line for transmitting an internal clock signal, and a plurality of internal circuits which operate in response to a corresponding local clock signal, the method comprising the steps of:

receiving signals at two points on the clock signal line in the vicinity of at least one of the plurality of internal circuits;

blending the received signals;

generating the corresponding local clock signal from the blended received signals: and wherein the blending step and the generating step comprise the steps of:

inverting one of the received signals;

inverting the other signal;

blending the two inverted signals;

inverting the blended signal; and outputting the inverted blended signal as the corresponding local clock signal.

14. An internal clock signal generating method for a semiconductor memory device including a clock signal line for transmitting an internal clock signal, and a plurality of internal circuits which operate in response to a corresponding local clock signal, the internal circuits having an associated delay time, the method comprising the steps of:

receiving signals at two points on the clock signal line and blending the received signals to generate the corresponding local clock signal;

generating a dummy local clock signal having substantially the same phase as the generated corresponding local clock signal;

delaying the dummy local clock signal for the delay time of the internal circuits to generate a feedback clock signal; and generating the internal clock signal corresponding to a phase difference between the feedback clock signal and an external clock signal input from the outside of the semiconductor memory device.

15. The internal clock signal generating method as claimed in claim 14, wherein the dummy local clock signal generating step comprises the steps of:

receiving signals at two different points on the clock signal line;

blending the received signals; and generating the dummy local clock signal.

16. The internal clock signal generating method as claimed in claim 14, wherein the internal clock signal generating step comprises the steps of:

comparing a phase of the external clock signal to a phase of the feedback clock signal to detect the phase difference;

generating a delay control signal in response to the detected phase difference; and determining a delay time in response to the delay control signal, delaying the external clock signal for the delay time, and outputting the delayed external clock signal as the internal clock signal.

* * * * *